United States Patent
Hanyu et al.

(10) Patent No.: US 8,420,575 B2
(45) Date of Patent: Apr. 16, 2013

(54) UNDERLYING LAYER OF ALIGNMENT FILM FOR OXIDE SUPERCONDUCTING CONDUCTOR AND METHOD OF FORMING SAME, AND DEVICE FOR FORMING SAME

(75) Inventors: Satoru Hanyu, Sakura (JP); Yasuhiro Iijima, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 13/440,516

(22) Filed: Apr. 5, 2012

(65) Prior Publication Data
US 2012/0196752 A1 Aug. 2, 2012

Related U.S. Application Data

(63) Continuation of application No. PCT/JP2010/067624, filed on Oct. 7, 2010.

(30) Foreign Application Priority Data

Oct. 7, 2009 (JP) .................................. 2009-233764

(51) Int. Cl.
*H01L 39/24* (2006.01)
(52) U.S. Cl.
USPC ......................................... 505/480; 505/511
(58) Field of Classification Search .................. 505/325, 505/480, 511, 730
See application file for complete search history.

(56) References Cited

U.S. PATENT DOCUMENTS

| 6,921,741 B2 | 7/2005 | Arendt et al. |
| 6,933,065 B2 | 8/2005 | Arendt et al. |

FOREIGN PATENT DOCUMENTS

| JP | 1-137525 A | 5/1989 |
| JP | 2-152110 A | 6/1990 |
| JP | 5-6586 A | 1/1993 |
| JP | 2558880 B2 | 11/1996 |
| JP | 2004-263227 A | 9/2004 |
| JP | 2005-113220 A | 4/2005 |
| JP | 2010-86796 A | 4/2010 |
| JP | 2010-123516 A | 6/2010 |

OTHER PUBLICATIONS

International Search Report for PCT/JP2010/067624 dated Jan. 18, 2011.

*Primary Examiner* — Colleen Dunn
(74) *Attorney, Agent, or Firm* — Sughrue Mion, PLLC

(57) ABSTRACT

A method of forming an underlying layer of an alignment film for an oxide superconducting conductor, includes arranging two or more kinds of targets along a lengthwise direction of a base material so as to face a surface of the base material; simultaneously irradiating an ion beam on surfaces of the two or more kinds of targets to deposit constituent particles of the targets on the surface of the base material in the order of the arrangement of the two or more kinds of targets; and forming a laminate in which two or more kinds of thin films are repeatedly laminated on the surface of the base material by passing the base material through a deposition region of the constituent particles a plurality of times so that the constituent particles of the targets are repeatedly deposited on the surface of the base material at each passage.

11 Claims, 5 Drawing Sheets

UNDERLYING LAYER OF ALIGNMENT FILM FOR OXIDE SUPERCONDUCTING CONDUCTOR AND METHOD OF FORMING SAME, AND DEVICE FOR FORMING SAME

CROSS REFERENCE TO RELATED APPLICATIONS

This application is a continuation application based on a PCT Patent Application No. PCT/JP2010/067624, filed Oct. 7, 2010, whose priority is claimed on Japanese Patent Application No. 2009-233764 filed Oct. 7, 2009, the entire content of which are hereby incorporated by reference.

BACKGROUND OF THE INVENTION

1. Field of the Invention

The present invention relates to an underlying layer of an alignment film for an oxide superconducting conductor, a method of forming the same, and a device for forming the same. In greater detail, it relates to an underlying layer of an alignment film for an oxide superconducting conductor in which two or more kinds of thin films are repeatedly laminated, and a method for forming the same, and a device for forming the same.

2. Description of the Related Art

In order to use an oxide superconductor as a superconducting conductor, it is necessary to form a thin film of an oxide superconductor with good crystal orientation on an elongated, such as tape-shaped, base material.

However, generally a metal tape itself is a polycrystalline body, and since the crystal structure thereof greatly differs from that of an oxide superconductor, it is difficult to directly form a thin film of an oxide superconductor with a good crystal orientation on a metal tape.

Also, since there is difference in the coefficient of thermal expansion and a lattice constant between the base material and the superconductor, in the process of cooling until the superconducting critical temperature, there are also the problems of deformation arising in the superconductor, or the oxide superconductor film exfoliating from the substrate.

Therefore, an intermediate layer (alignment film) is formed on the metal base material, and an oxide superconductor film is formed on this intermediate layer (alignment film). This intermediate layer (alignment film) consists of a material such as MgO, YSZ (yttria-stabilized zirconia), $SrTiO_3$ of which the physical characteristic value such as the coefficient of thermal expansion or lattice constant shows an intermediate value between the base material and the superconductor. The crystal orientation of this intermediate layer (alignment film) has a significant effect on the crystal orientation of the oxide superconductor film that is formed on this intermediate layer.

For that reason, the applicants developed the ion beam assisted deposition (IBAD) method as a film forming method that forms an intermediate layer (alignment film) having a good crystal orientation. This ion beam assist method is a technique of depositing on a base material constituent particles that are ejected from a target by a sputtering method, while simultaneously irradiating from an oblique direction (for example, 45 degrees) argon ions and oxygen ions, etc. which are generated from an ion gun. According to this method, it is possible to form an intermediate layer (alignment film) that has a favorable crystal orientation on a base material.

Furthermore, when forming an oxide superconductive layer (oxide superconductor film) on this intermediate layer (alignment film), it is possible to form an oxide superconductive layer in which the crystal orientation is excellent and the critical current density is high.

Also, consideration has been given to laminating an $Al_2O_3$ film and a $Y_2O_3$ film in succession on a base material, and forming an intermediate layer (alignment film) thereon by the IBAD method (for example, refer to U.S. Pat. No. 6,921,741 and U.S. Pat. No. 6,933,065). By forming the intermediate layer (alignment film) on the $Y_2O_3$ film (bed layer), it is possible to further improve the crystal orientation state. Also, the $Al_2O_3$ layer (diffusion prevention layer) is provided in order to prevent the problem of the metal base material constituent element diffusing from the metal base material to the oxide superconductive layer in the high-temperature process during manufacture of the oxide superconducting conductor.

As a method of forming a thin film that can effectively use the film formation area when forming the diffusion prevention layer and the bed layer on a metal tape wire, the applicants proposed a method of forming a thin film by causing a strip-like base material to pass multiple times through deposition regions of vapor-deposition particles, to cause the vapor-deposition particles to be deposited on the strip-like base material in each pass (for example, refer to Japanese Unexamined Patent Application, First Publication No. 2004-263227).

Also, as a method of forming a multi-layer film that has a repeated structure using a plurality of targets, there is a method that controls the operation of the vapor deposition mechanism by providing a shutter or slit in the upper portion of the target (for example, refer to Japanese Patent No. 2558880), and a film formation method that provides a plurality of targets under a cylindrical drum, and rotates the drum with an elongated base material being spirally wound on the cylindrical drum (for example, refer to Japanese Unexamined Patent Application, First Publication No. H05-6586).

Due to such vigorous research and development, technology to make the intermediate layer (alignment film) thinner in the state of having a good crystal orientation has been put to practical use. However, by making the intermediate layer (alignment film) thin, there is the problem of the metal base material constituent element diffusing from the metal base material to the oxide superconductor during the high-temperature process during manufacture of the oxide superconducting conductor.

In order to solve this problem, it is indispensable to insert an underlying layer of the intermediate layer (alignment film) such as a diffusion prevention layer between the metal base material and the intermediate layer (alignment film). Preventing diffusion of a metal base material constituent element can be achieved by increasing the thickness of the film of the diffusion prevention layer. However, since there is the problem of the substrate warping due to an increase in the internal stress of the film when the thickness is increased, it is sought to further increase the diffusion prevention effect of the underlying layer of an alignment film by a method other than increasing the film thickness.

In the related art disclosed in the aforementioned Japanese Unexamined Patent Application, First Publication No. 2004-263227, as a method for causing a strip-like base material to pass multiple times through deposition regions of vapor-deposition particles, a pair of winding member groups, which consist of a plurality of coaxially disposed winding members that wind the strip-like base material, are oppositely arranged, and the base material that is wound on this pair of winding member groups is made to loop around to perform thin-film formation as a plurality of rows within the deposition region of the vapor-deposition particles. According to this related method, it is possible to effectively use the film formation area, but in the case of using two or more kinds of targets, it is necessary to perform two or more film formation processes. According to this related method, in order to form the diffusion prevention layer and the bed layer on the strip-like base material, it is necessary to first install a target for the diffusion prevention layer such as $Al_2O_3$ to form the diffusion prevention layer, then replace the target with a target for the bed layer such as $Y_2O_3$, so there has been a problem in terms of productivity.

Also, the film formation method disclosed in the aforementioned Japanese Patent No. 2558880, which is a method that forms a multi-layer film having a repeated structure using a plurality of targets, can only be applied to film formation on a plate-like base material, and so cannot be applied as a film-formation method of a multi-layer film to an elongated base material.

On the other hand, in the film formation method disclosed in the aforementioned Japanese Unexamined Patent Application, First Publication No. H05-6586, obtaining a film with a single crystal state having a good crystal orientation is not assumed.

SUMMARY

The present invention was achieved in view of the conventional circumstances, and has as its first object to provide a method of forming an underlying layer of an alignment film for a superconducting conductor with a high diffusion prevention effect that enables a reduction in production costs, and in greater detail a method of forming an underlying layer of an alignment film for an oxide superconducting conductor in which two or more kinds of thin films are repeatedly laminated.

Also, a second object of the present invention is to provide an underlying layer of an alignment film for an oxide superconducting conductor with a high diffusion prevention effect.

Moreover, a third object of the present invention is to provide a device for forming an underlying layer of an alignment film for an oxide superconducting conductor with a high diffusion prevention effect that enables a reduction in production costs, and in greater detail, a device for forming an underlying layer of an alignment film for an oxide superconducting conductor in which two or more kinds of thin films are repeatedly laminated.

In order to solve the aforementioned problems, the present invention adopts the following constitution.

(1) A method of forming an underlying layer of an alignment film for an oxide superconducting conductor, includes arranging two or more kinds of targets along a lengthwise direction of a base material so as to face a surface of the base material; simultaneously irradiating an ion beam on surfaces of the two or more kinds of targets to deposit constituent particles of the two or more kinds of targets on the surface of the base material in the order of the arrangement of the two or more kinds of targets; and forming a laminate in which two or more kinds of thin films are repeatedly laminated on the surface of the base material by passing the base material through a deposition region of the constituent particles a plurality of times so that the constituent particles of the two or more kinds of targets are repeatedly deposited on the surface of the base material at each passage.

(2) The two or more kinds of targets may include a target that uses a material for a diffusion prevention layer and a target that uses a material for a bed layer; a rock salt structure layer may be formed by an ion beam assist method on a surface of the bed layer that is formed by the target that uses the material for the bed layer; and the bed layer may order the crystal orientation of the rock salt structure layer.

(3) An underlying layer of an alignment film for an oxide superconducting conductor that is provided between a base material and a rock salt structure layer that is formed by an ion beam assist method, being provided with a laminate in which two or more kinds of thin films are repeatedly laminated.

(4) The laminate may include a diffusion prevention layer and a bed layer being repeatedly laminated.

(5) The underlying layer of an alignment film for an oxide superconducting conductor may be formed by the method recited in the aforementioned (1).

(6) A film forming device for an underlying layer of an alignment film for an oxide superconducting conductor, includes a base material feed mechanism that feeds a base material; a base material take-up mechanism that takes up the base material; at least a pair of turnaround member groups consisting of a plurality of coaxially disposed turnaround members that change a movement direction of the base material, which travels between the base material feed mechanism and the base material take-up mechanism; two or more kinds of targets that are arranged in a row in a lengthwise direction of the base material, facing the surface of the base material which travels between the turnaround member groups; and an ion beam generating mechanism that simultaneously irradiates an ion beam on the two or more kinds of targets.

(7) A laminate in which two or more kinds of thin films are repeatedly laminated on the surface of the base material may be formed by simultaneously irradiating an ion beam on surfaces of the two or more kinds of targets to cause constituent particles of the two or more kinds of targets to be deposited on the surface of the base material in the order of the arrangement of the two or more kinds of targets.

(8) At least a pair of the turnaround member groups may be arranged so that their respective axes are mutually parallel.

(9) A plurality of rows of the base material may be disposed in a deposition region of constituent particles of the two or more kinds of targets by causing the base material to travel a plurality of times between the turnaround member groups.

(10) The laminate in which two or more kinds of thin films are repeatedly laminated may include at least a dispersion prevention layer and a bed layer.

According to the method of forming an underlying layer of an alignment film for an oxide superconducting conductor of the aforementioned aspect of the present invention, by simultaneously irradiating an ion beam on surfaces of the two or more kinds of targets and depositing constituent particles of the two or more kinds of targets on the base material in turn, it is possible to form an underlying layer of an alignment film for an oxide superconducting conductor by repeatedly laminating two or more kinds of thin films by one process. Thereby, it is possible to provide a film formation method that can shorten the film formation time of the underlying layer of an alignment film for an oxide superconducting conductor that has a laminate structure in which two or more kinds of thin films are repeatedly laminated, and that can lower production costs.

Also, according to the underlying layer of an alignment film for an oxide superconducting conductor of the aforementioned aspect of the present invention, since the underlying layer of an alignment film for an oxide superconducting conductor that is inserted between the base material and the rock salt structure layer that is formed by the ion beam assisted deposition (IBAD) method is provided with a laminate in which two or more kinds of thin films are repeatedly laminated, it is possible to also impart a diffused element trap effect at the interface of each thin film that is laminated.

Moreover, due to the aforementioned laminate being a laminate in which a diffusion prevention layer and a bed layer are repeatedly laminated, since in addition to the diffusion prevention effect of each diffusion prevention layer, it is possible to also impart a diffused element trap effect at the interface of each thin film that is laminated, it is possible to provide an underlying layer of an alignment film for an oxide superconducting conductor with a high diffusion prevention effect.

Moreover, according to the device for forming the underlying layer of an alignment film for an oxide superconducting conductor of the aforementioned aspect of the present invention, by arranging in a row two or more kinds of targets in the lengthwise direction of the base material, facing the surface of the base material that travels between turnaround member groups that have a plurality of turnaround members, and simultaneously irradiating an ion beam on the surfaces of the two or more kinds of targets, it is possible to repeatedly laminate two or more kinds of thin films in one process. Accordingly, it is possible to provide a film forming device that can shorten the film formation time of the underlying layer of an alignment film for an oxide superconducting conductor that has a laminate structure in which two or more kinds of thin films are repeatedly laminated, and that can lower production costs. Moreover, by causing a base material to travel multiple times between turnaround member groups that are arranged so that their respective axes are mutually parallel, the base material is made to pass multiple times in a deposition region of constituent particles of the targets, and so it is possible to form a laminate consisting of a plurality of layers by repeatedly laminating two or more kinds of thin films in one process on the surface of the base material.

BRIEF DESCRIPTION OF THE DRAWINGS

FIG. 6 is a drawing that schematically shows one example of an ion gun that the film forming device shown in FIG. 5 is provided with.

DETAILED DESCRIPTION OF THE PREFERRED EMBODIMENTS

The embodiments of the present invention shall be described in detail below.

<Underlying Layer of an Alignment Film for an Oxide Superconducting Conductor>

First, the underlying layer of an alignment film for an oxide superconducting conductor according to one aspect of the present invention shall be described.

Figure 1:
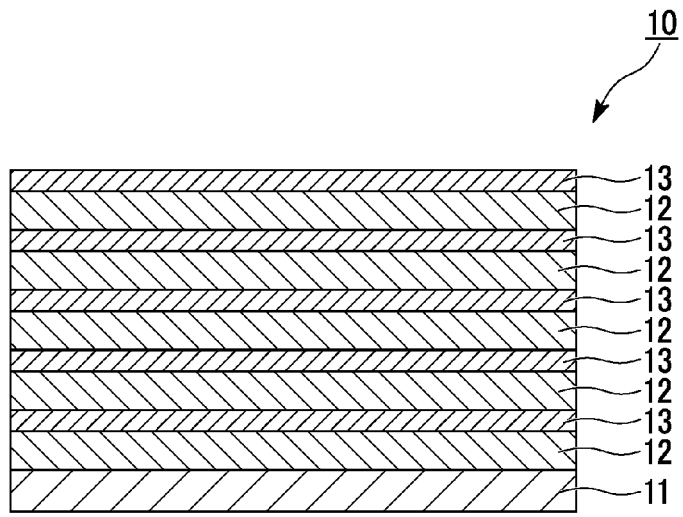
FIG. 1 is a drawing that schematically shows a cross-section of an underlying layer of an alignment film for a superconducting conductor that is one example of the underlying layer of an alignment film for an oxide superconducting conductor according to one aspect of the present invention.

The underlying layer of an alignment film for an oxide superconducting conductor according to one aspect of the present invention has a laminated structure in which two or more kinds of thin films are repeatedly laminated on a base material. FIG. 1 schematically shows a cross section of one example of the embodiment of the underlying layer of an alignment film for an oxide superconducting conductor of the present invention. In FIG. 1, there is a laminated structure in which the diffusion prevention layer 12 and the bed layer 13 are repeatedly laminated five times on the base material 11. In the present embodiment an underlying layer of an alignment film for an oxide superconducting conductor 10 in which two kinds of thin films are repeatedly laminated five times is shown as an example, but the present invention is not one that is limited thereto.

As the material that constitutes the base material 11, it is possible to use a metal such as Cu, Ni, Ti, Mo, Nb, Ta, W, Mn, Fe, Ag or the like with excellent strength and heat resistance, or alloys thereof. What is particularly preferred is stainless steel, Hastelloy, or another nickel-based alloy having excellent corrosion resistance and heat resistance. Alternatively, in addition to these a ceramic base material, an amorphous alloy or the like may be used.

Figure 2:
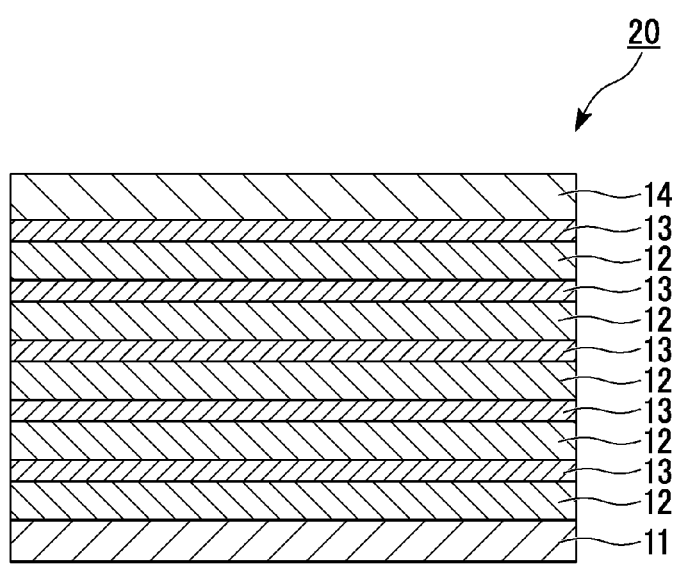
FIG. 2 is a drawing that schematically shows a cross-section of one example of the intermediate layer in which an MgO layer is laminated on the underlying layer of an alignment film for an oxide superconducting conductor according to one aspect of the present invention.

FIG. 2 shows the structure of an underlying layer of an alignment film for an oxide superconducting conductor according to another embodiment of the present invention. As shown in FIG. 2, a laminated body of the diffusion prevention layer 12 and the bed layer 13 is provided between a rock salt structure layer that is formed by the ion beam assisted deposition (IBAD) method (hereinbelow called an "IBAD-rock salt structure layer" or "rock salt structure layer") and the base material 11. The thin film that constitutes this underlying layer of an alignment film for an oxide superconducting conductor is not particularly limited provided it is a material that can be used as the underlying layer of the IBAD-rock salt structure layer 14, but it is preferably the laminated body of the diffusion prevention layer 12 or the bed layer 13. As shown in FIG. 1 and FIG. 2, in the repeated laminated structure, it is particularly preferred that the layer on the base material 1 side be the diffusion prevention layer 12, and the layer on the rock salt structure layer 14 side of this laminated structure be the bed layer 13. By laminating the diffusion prevention layer 12 on the base material 11, it is possible to suppress the diffusion of the base material constituent particles from the base material 11 to the surface side of the thin film laminate. Also, since the IBAD-rock salt structure layer 14 is formed on the bed layer 13, it is formed with a good crystal orientation state.

Examples of the material of the diffusion prevention layer 12 include silicon nitride ($Si_3N_4$) or aluminum oxide ($Al_2O_3$, also called "alumina"), and a rare-earth metal oxide such as $Gd_2Zr_2O_7$. The diffusion prevention layer 12 is provided in order to prevent diffusion of the constituent element of the base material 11. The diffusion prevention layer 12 is formed multiple times on the base material 11, with the total thickness of the laminated diffusion prevention layer 12 preferably being in the range of 10 to 400 nm. When the total thickness of the diffusion prevention layer 12 is less than 10 nm, there is a risk of not being able to sufficiently prevent diffusion of the constituent element of the base material 11. Also, it is preferable for the thickness of each diffusion prevention layer 12 (single diffusion prevention layer) to be 2 nm or more. When the thickness of each diffusion prevention layer 12 is less than 2 nm, the interface with the thin film that is laminated above and below the diffusion prevention layer 12 is hard to form, and so the effect of trapping the diffusing elements in the interface between the thin films can no longer be manifested.

The bed layer 13 is a layer that has high thermal resistance and serves to further reduce the interfacial reactivity, and functions to obtain alignment of the rock salt structure layer 14 that is arranged thereon. This kind of bed layer 13 is disposed as required, and for example it is possible to use a rare-earth oxide layer. The rare-earth oxide includes those represented by the composition formula $(\alpha_1 O_2)_{2X} (\beta_2 O_3)_{(1-X)}$. Here, $\alpha$ and $\beta$ represent rare earth elements, and x is in an amount of $0 \leq x \leq 1$. In greater detail, examples include $ZrO_2$, $Y_2O_3$, $CeO_2$, $Dy_2O_3$, $Er_2O_3$, $Eu_2O_3$, $Ho_2O_3$, $La_2O_3$, $Lu_2O_3$, $Nd_2O_3$, $Sc_2O_3$, $Sm_2O_3$, $Tm_2O_3$, $Yb_2O_3$, and the like. Moreover, examples of the rare earth oxide include $Pr_6O_{11}$, $Tb_4O_7$, and the like. The bed layer 13 is formed multiple times on the base material 11 and the diffusion prevention layer 12, with the total thickness of the laminated bed layers 13 preferably being in the range of 10 to 100 nm.

The underlying layer of an alignment film for an oxide superconducting conductor according to one aspect of the present invention, by being a laminated structure in which two or more kinds of thin films are repeatedly laminated, can trap the diffusion of a base material constituent element from the base material to the surface side of the thin film laminate in each interface of each thin film, and so it is possible to achieve a high diffusion prevention effect.

Since the ease of diffusion of the base material constituent element differs depending on the type of thin film, even if it passes through a thin film that easily diffuses, since a thin film that hinders diffusion is laminated on this thin film, the laminated interface of that thin film functions as a wall, and so the diffusion element is trapped by that interface.

Also, the diffusion of the base material constituent element diffuses with priority in the planar direction through the interface of a dissimilar material that has more strain than within a single substance. In the underlying layer of an alignment film for an oxide superconducting conductor according to one aspect of the present invention, since two or more types of thin films are respectively laminated in a repeating manner for at least two layers, a plurality of these interfaces exist. The more repetition a structure has, that is, the more the interfaces there are, the greater the diffusion prevention effect.

In the underlying layer of an alignment film for an oxide superconducting conductor according to one aspect of the present invention, obtaining a particularly high diffusion prevention effect is a case of taking a constitution of the underlying layer of an alignment film for an oxide superconducting conductor 10.

Figure 3:
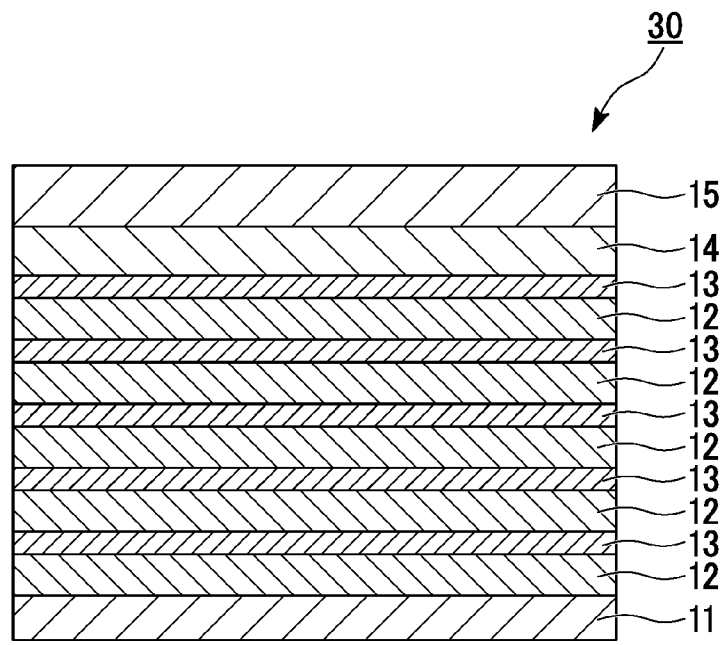
FIG. 3 is a drawing that schematically shows a cross-section of one example of an oxide superconducting conductor that uses the underlying layer of an alignment film for an oxide superconducting conductor according to one aspect of the present invention.

For example, as shown in FIG. 3, in the case of forming the rock salt structure layer 14, the oxide superconductive layer 15 and a gap layer (not illustrated) on the bed layer 13 as in FIG. 3, inevitably a thermal history is received as a result of being heated and heat treated. In this case, since the underlying layer of an alignment film for an oxide superconducting conductor 10 is a laminated structure in which the diffusion prevention layer 12 and the bed layer 13 are repeatedly laminated, it is possible to inhibit a portion of the constituent elements of the base material 11 from diffusing to the oxide superconductive layer 15 via the underlying layer of an alignment film for an oxide superconducting conductor 10 (the diffusion prevention layer 12 and the bed layer 13 and the like). Since it is also possible to impart a trap effect of the diffused element in each interface of the diffusion prevention layer 12 and the bed layer 13 to the diffusion prevention effect of the diffusion prevention layer 12 itself, it is possible to more effectively inhibit the diffusion of the base material constituent elements.

Also, according to the underlying layer of an alignment film for an oxide superconducting conductor according to one aspect of the present invention, compared to the convention underlying layer of an alignment film that laminates the diffusion prevention layer and the bed layer for each one layer, a high diffusion prevention effect is obtained, so it is also possible to make thinner the film thickness of this underlying layer of an alignment film for an oxide superconducting conductor.

In the rock salt structure layer 14, the crystal structure has a rock salt structure. Examples of the material that has this kind of rock salt structure include those represented by a composition formula $\gamma O$. Here, examples of $\gamma$ include any of the elements Mg, Ni, Sr, Ca and Ba.

In order to manufacture an MgO layer as the rock salt structure layer 14 by the IBAD method, MgO or Mg or the like is used as the target, and oxygen gas may be supplied to the film forming atmosphere as required to perform film forming while an ion assist beam consisting of a noble gas ion beam such as Ar or the like is made incident on the substrate in a range of 40 to 60 degrees. By performing film formation with the IBAD method, it is possible to form a biaxially oriented MgO layer (rock salt structure surface 14) with a good crystal orientation state. Thereby, it is possible to form an oxide superconductive layer that is laminated on the MgO layer (rock salt structure layer 14) with a good crystal orientation state. The thickness of the MgO layer (the rock salt structure layer 14) is preferably 1 nm or more and 500 nm or less. When it exceeds 500 nm, the surface roughness becomes large, and there is a risk of the critical current density decreasing.

The method of forming the underlying layer of an alignment film for an oxide superconducting conductor according to one aspect of the present invention is not particularly limited, provided it is a conventional publicly known film forming method. However, it is preferably formed by a method and device for forming the underlying layer of an alignment film for an oxide superconducting conductor described below.

<Method and Device for Forming the Underlying Layer of an Alignment Film for an Oxide Superconducting Conductor>

One embodiment of the film forming method and film forming device for forming the underlying layer of an alignment film for an oxide superconducting conductor of the present invention shall be described based on the drawings. In the present embodiment, the explanation is given using the underlying layer of an alignment film for an oxide superconducting conductor 10 as an example, but this underlying layer of an alignment film for an oxide superconducting conductor 10 is one that is described in detail in order to better comprehend the gist of the invention, and unless otherwise specified, does not serve to limit the present invention.

Figure 4:
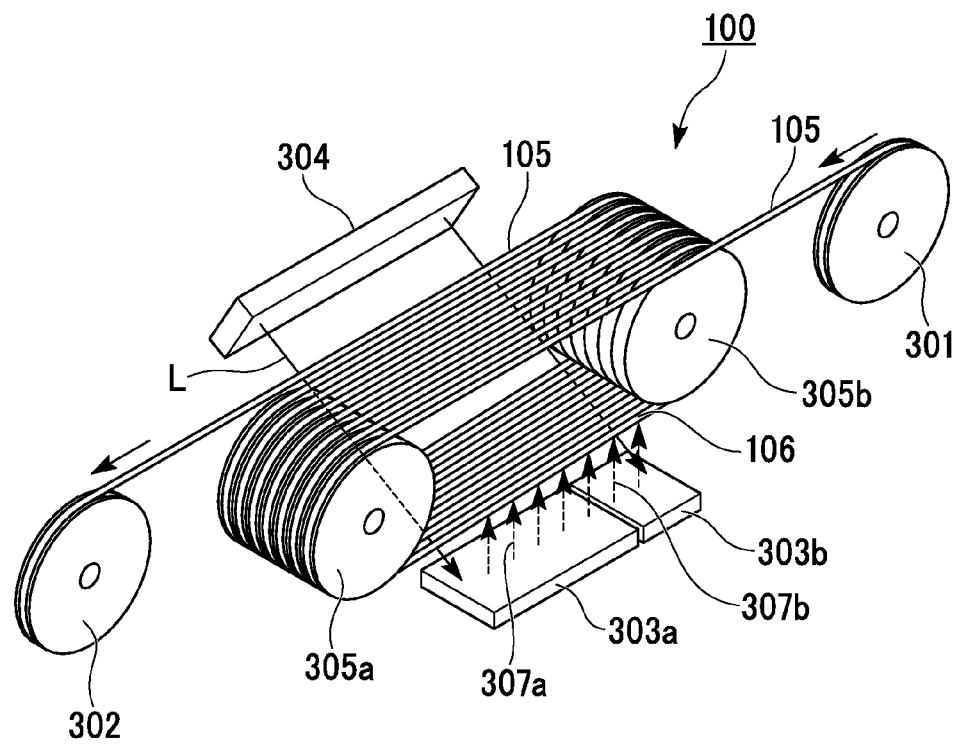
FIG. 4 is a perspective view that schematically shows one example of a film forming device according to one aspect of the present invention.

FIG. 4 is a perspective view that shows an outline of the film forming device for forming the underlying layer of an alignment film for an oxide superconducting conductor 10.

The film forming device 100 shown in FIG. 4 is a film forming device that is provided in an aspect that is housed in a treatment container (not illustrated), and while causing a strip-like base material 105 to travel, continuously laminates two or more types of thin films repeatedly on a surface of this base material 105.

This film forming device 100 is provided with a travel system in which the base material 105 travels multiple laps around a race track-like path, two types of rectangular, plate-shaped targets 303a and 303b that are arranged opposing the surface of the base material 105, and an ion beam generating source (ion beam generating mechanism) 304 that simultaneously irradiates an ion beam L on the surfaces of these targets 303a and 303b. The aforementioned two types of rectangular, plate-shaped targets 303a and 303b are lined up along the lengthwise direction of the base material 105 (the travel direction of the base material).

The travel system in which the base material 105 travels multiple laps around a race track-like path is provided with a first turnaround member group 305a and a second turnaround member group 305b. The first turnaround member group 305a is provided with a plurality of reel-shaped turnaround members (seven shown in FIG. 4) that are arranged coaxially, and turns the travel direction of the base material 105. Similarly, the second turnaround member group 305b is provided with a plurality of turnaround members (seven shown in FIG. 4) having the same structure as the first turnaround member group 305a, and the plurality of turnaround members are coaxially arranged. Similarly to the first turnaround member group 305a, the second turnaround member group 305b turns the travel direction of the base material 105. Note that the first turnaround member group 305a and the second turnaround member group 305b are arranged so that their respective axes are mutually parallel.

Moreover, the aforementioned travel system is provided with a base material feed mechanism 301 for feeding the base material 105 and a base material take-up mechanism 302 for taking up (wind) the base material 105. The base material feed mechanism 301 is provided on the outer side of the second turnaround member group 305b. The base material take-up mechanism 302 is provided on the outer side of the first turnaround member group 305a. By driving the turnaround member groups 305a, 305b, the base material feed mechanism 301, and the base material take-up mechanism 302 with a driving apparatus (not illustrated) in a mutually synchronized manner, the base material 105 that is fed out at a predetermined speed from the base material feed mechanism 301 goes around the turnaround member groups 305a, 305b and is taken up by the base material take-up mechanism 302.

As shown in FIG. 4, the turnaround member groups 305a, 305b are constitutions in which turnaround members of the same diameter are coaxially disposed. Also, a base material portion 106 that faces the targets 303a, 303b (the portion of the base material that is opposed to the targets 303a, 303b to form a laminate) is positioned equidistant from the targets 303a and 303b. Each turnaround member has a length in the axial direction that corresponds to the width of the base material 105, and it is preferable for the plurality of rows of the base material 105 to be disposed with no gaps.

Each turnaround member that constitutes the turnaround member groups 305a, 305b preferably has a curved side face (curved face) that smoothly turns the direction of movement of the base material 105, such as a shape that is cylindrical or disk-shaped, semi-cylindrical or semidisk-shaped, or elliptical cylindrical or elliptical disk-shaped. Note that "cylindrical or disk-shaped" implies no particular limitation to the ratio of the diameter of the turnaround members and the length in the axial direction.

The turnaround member groups 305a, 305b may be constituted to rotate with the base material 105 that is being conveyed, or the turnaround member groups 305a, 305b may be constituted so as not to move, with the base material 105 sliding on the side faces thereof. In the case of rotating the turnaround member groups 305a, 305b, a driving mechanism (not illustrated) that causes the turnaround member groups 305a, 305b to rotate in conformity with the moving speed of the base material 105 may be provided.

The targets 303a and 303b are arranged in a row in the lengthwise direction of the base material 105, facing the surface of the base material portion 106 that travels between the turnaround member groups 305a, 305b. The ion beam L is irradiated from an ion beam generating mechanism 304 to these targets 303a and 303b.

Since the targets 303a and 303b are used for forming the thin film that constitutes the underlying layer of an alignment film for an oxide superconducting conductor, the materials given as the diffusion prevention layer 12 and the bed layer 13 can be given as preferred ones, and as the shapes of these targets 303a and 303b, plate-shaped ones are used.

The ion beam generating mechanism 304 that irradiates the ion beam L onto the targets 303a and 303b may be one that generates an ion beam L that can eject or evaporate the constituent particles from the targets 303a and 303b. The ion type, power, and irradiation energy and the like can be suitably set in accordance with the material of the targets 303a and 303b and the deposition rate.

The ion beam generating mechanism 304 of the present embodiment has a width so as to be able to simultaneously irradiate an ion beam on the targets 303a and 303b disposed in a row along with the lengthwise direction of the base material 105, as shown in FIG. 4. Thereby, a particle group 307a from the target 303a, and a particle group 307b from the target 303b are simultaneously generated, and it is possible to repeatedly deposit the constituent particles of the targets 303a and 303b on the surface of the base material portion 106 that travels between the turnaround member groups 305a and 305b. As a result, in the film forming method and film forming device 100 of the present embodiment, it is possible to significantly improve productivity without the need to exchange the targets for each lamination as in the case of conventional film forming devices.

The film forming device 100 can perform the film formation while applying heat, with a heating device (not illustrated). In that case, the heating device may be provided so as to surround at least one of the travel system of the base material 105 and the entire film forming device 100, and may be provided on the back side of the base material portion 106 (the surface side on which the laminate is not formed) that travels through the deposition region of the constituent particles of the targets 303a and 303b. In the case of performing film formation while applying heat, the turnaround member groups 305a and 305b preferably have a comparatively large heat capacity.

The film forming device 100 is provided in a treatment container (not illustrated). This treatment container has a structure in which an evacuation device is connected via an exhaust hole, and it is possible to reduce the pressure in the treatment container to a predetermined pressure. Thereby, while the pressure in the treatment container is reduced to the predetermined pressure, the entirety of the base material 105 in the lengthwise direction that is attached to the film forming device 100 is placed in a reduced pressure in the treatment container.

Next, the method of forming the underlying layer of an alignment film for an oxide superconducting conductor 10 shown in FIG. 1, using this film forming device 100, shall be described based on FIG. 4.

The strip-like base material 105 (the base material 11 in FIG. 1) is wound around the turnaround member groups 305a and 305b so that the surface side (or the surface side to be laminated with the thin film) may be on the side of the targets 303a and 303b. Since the underlying layer of an alignment film for an oxide superconducting conductor 10 shown in FIG. 1 is a laminate in which two kinds of thin films are repeatedly laminated five times, the number of turnaround members that constitute the turnaround member groups 305a and 305b is five each, and the lane number is made to be five. Also, a plate-shaped target that consists of a diffusion prevention layer material is fixed as the target 303a, and a plate-shaped target that consists of the bed-layer material is fixed as the target 303b, using fixture. By suitably adjusting the length in the lengthwise direction of the targets 303a and 303b, it is possible to form the diffusion prevention layer 12 and the bed layer 13 of the desired thickness. The length in the lengthwise direction of the targets 303a and 303b can be suitably adjusted in consideration of the material of the targets, the deposition rate, and the type, power and irradiation energy of the ion beam L to be irradiated.

Next, the interior of the treatment container that is not illustrated is decompressed to the predetermined pressure with an evacuation device. Here, oxygen gas may be introduced into the treatment container if needed, to produce an oxygen environment within the treatment container.

Next, the base material feed mechanism 301, the turnaround member groups 305a and 305b, and the base material take-up mechanism 302 are simultaneously driven, and the base material 105 is moved at a predetermined speed from the base material feed mechanism 301 to the base material take-up mechanism 302. Simultaneously, in the case of wanting to perform film formation while applying heat, the entire film forming device 100 or the base material 105 is maintained at a desired temperature by the heating mechanism not illustrated.

Next, the ion beam L is simultaneously irradiated on the target 303a and the target 303b by the ion beam generating mechanism 304. The constituent particles that are ejected or evaporated from the target 303a by the ion beam L become a particle group 307a whose cross-sectional area in the radial direction is expanded, and cover the deposition area over the base material portion 106 that travels facing the target 303a. Also, constituent particles that are ejected or evaporated from the target 303b by the ion beam L become a particle group 307b whose cross-sectional area in the radial direction is expanded, and cover the deposition area over the base material portion 106 that travels facing the target 303b.

Thereby, while the base material 105 goes around from the turnaround member group 305a toward the turnaround member group 305b, the diffusion prevention layer 12 is formed on the base material 105 from the target 303a, and furthermore the bed layer 13 is successively laminated on the diffusion prevention layer 12 from the target 303b. In the present embodiment, since there are five lanes, the base material 105 passes through the particle groups 307a and 307b five times. Each time it passes through the particle groups 307a and 307b, the diffusion prevention layer 12 and the bed layer 13 are successively formed. As a result, the underlying layer of an alignment film for an oxide superconducting conductor 10 that consists of the diffusion prevention layer 12 and the bed layer 13 being repeatedly laminated as shown in FIG. 1 is formed.

The present embodiment described the underlying layer of an alignment film for an oxide superconducting conductor 10 in which the diffusion prevention layer 12 and the bed layer 13 are repeatedly laminated five times, but the present embodiment is not one that is limited thereto. In the film forming device 100, by increasing the number of targets that are arranged in a row in the lengthwise direction of the traveling base material 105, it is also possible to repeatedly laminate three or more kinds of thin films.

According to the method of forming an underlying layer of an alignment film for an oxide superconducting conductor according to one aspect of the present invention, by simultaneously irradiating an ion beam on the surfaces of two or more kinds of targets, ejecting or evaporating constituent particles of the targets, and successively depositing the constituent particles of the aforementioned two or more kinds of targets on a strip-like base material, it is possible to form an underlying layer of an alignment film for an oxide superconducting conductor by repeatedly laminating two or more kinds of thin films in one process. Thereby, a shortening of the film formation time of the underlying layer of an alignment film for an oxide superconducting conductor that has the laminated structure in which two or more kinds of thin films are repeatedly laminated becomes possible, and so it is possible to provide a film formation method that enables a reduction in production costs.

Furthermore, according to the device for forming an underlying layer of an alignment film for an oxide superconducting conductor according to one aspect of the present invention, the strip-like base material is made to go around turnaround member groups that are arranged so that their respective axes are mutually parallel, and two or more kinds of targets are arranged in a row in the lengthwise direction of the base material, facing the surface of the base material that travels between the turnaround member groups, and by simultaneously irradiating an ion beam on the surfaces of the two or more types of targets to eject or evaporate constituent particles of these targets, the strip-like base material is made to pass multiple times through the deposition areas of the constituent particles of these targets. Thereby, since it is possible to repeatedly laminate two or more kinds of thin films on the base material in one process, a shortening of the film formation time of the underlying layer of an alignment film for an oxide superconducting conductor that has the laminated structure in which two or more kinds of thin films are repeatedly laminated becomes possible, and so it is possible to provide a film formation device that enables a reduction in production costs.

EXAMPLES

First, the film forming device by the IBAD method shall be described using the present Example.

Figure 5:
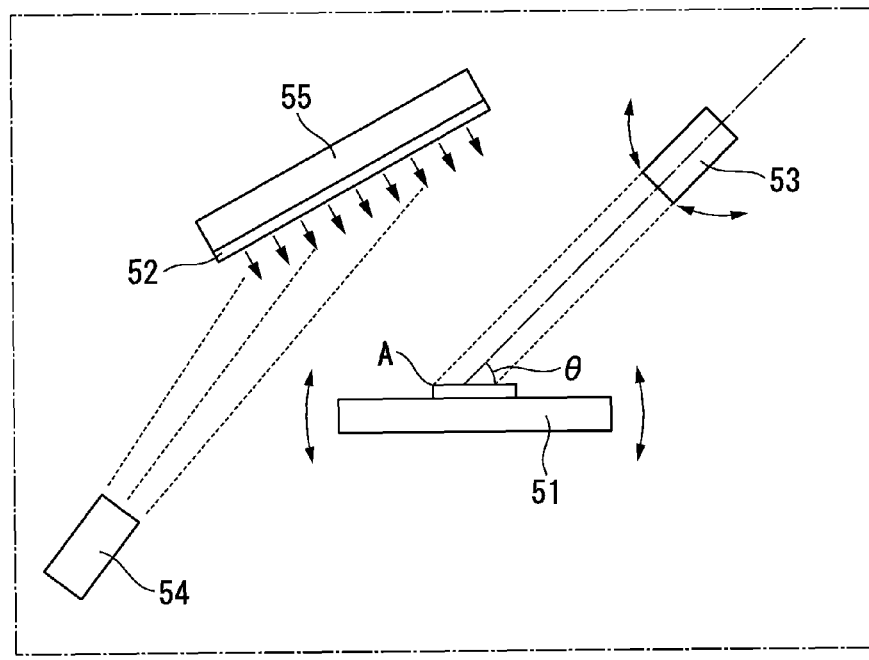
FIG. 5 is a drawing that schematically shows a film forming device according to the IBAD method.

FIG. 5 is one that shows an example of a device that manufactures a polycrystalline thin film, and the device of this example has a constitution of providing an ion gun for ion beam assisted deposition in a sputtering device.

This film forming device is constituted with a base material holder 51 that holds the base material A horizontally, a plate-shaped target 52, an ion gun 53, and a sputtering beam irradiation device 54 serving as the main components.

The plate-shaped target 52 is arranged obliquely above this base material holder 51 (for example, obliquely above on the left side) with a predetermined interval, so as to obliquely face the base material holder 51, and arranged apart from the target 52.

The ion gun 53 is arranged obliquely above this base material holder 51 (for example, obliquely above on the right side) with a predetermined interval, so as to obliquely face the base material holder 51, and arranged apart from the target 52.

The sputtering beam irradiation device 54 is arranged below the target 52, facing the bottom surface of the target 52 (the surface on the opposite side of the target 52). Also, the reference numeral 55 in the drawing denotes a target holder that holds the target 52.

Also, the film forming device is housed in a vacuum container not illustrated, so it is possible to maintain a vacuum atmosphere around the base material A. Furthermore, an atmosphere gas supply source such as a gas cylinder or the like is connected to the aforementioned vacuum container, so it is possible to make the interior of the vacuum container an atmosphere of argon gas or another inert gas, or an inert gas atmosphere that includes oxygen, in a low-pressure state such as a vacuum.

Note that in the present example, the base material 11 that is used in the underlying layer of an alignment film for an oxide superconducting conductor 10 that is created by the film forming device 100 shown in FIG. 4 serves as the base material A.

Note that in the case of using an elongated metal tape as the base material A, by providing a feed device and take-up device for the metal tape in the interior of the vacuum container, and by feeding the base material A continuously from the feed device to the base material holder 51, and taking it up by the take-up device, it is possible to continuously form a polycrystalline thin film on a tape-like base material.

The interior of the base material holder 51 is equipped with a heating heater. With this heating heater, the base material A that is positioned on the base material holder 51 can be heated to the required temperature. Moreover, an angle adjusting mechanism that adjusts the horizontal angle of the base material holder 51 is provided at the bottom of the base material holder 51 (the surface on the opposite side of the surface on which the base material A is formed). Note that it is not limited only to this, and this angle adjusting mechanism may also be installed on the ion gun 53 to adjust the angle of gradient of the ion gun 53, so as to adjust the irradiation angle of the ions.

The target 52 is one for forming the MgO layer that is the intended rock salt structure layer, and specifically, the film formation may be performed using MgO or Mg, with oxygen gas being supplied to the film formation atmosphere as required.

The ion gun 53 introduces gas to be ionized into the interior of the container thereof, and the ion gun 53 is provided with a lead-out electrode on the front face thereof. It is a device that ionizes some of the atoms or molecules of the gas, and irradiates them as an ion beam by controlling the ionized particles with an electric field that is generated by the lead-out electrode. Various ways of ionizing gas include the high-frequency excitation system and the filament system. The filament system is a method that generates thermo electrons by passing electricity to a filament made of tungsten, and ionizes them by causing them to collide with gas molecules in a high vacuum. Also, the high-frequency excitation system is an ionization method that polarizes gas molecules by a high-frequency electric field in a high vacuum.

Figure 6:
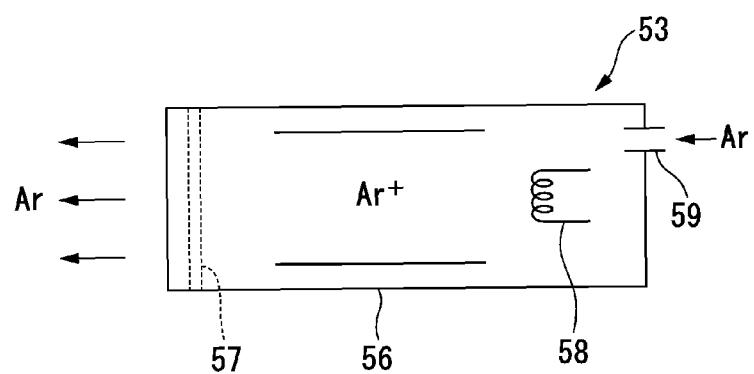

In the present example, the ion gun 53 that has an internal structure of the configuration shown in FIG. 6 is used. This ion gun 53 is equipped with a cylindrical container 56, and moreover equipped with a lead-out electrode 57, a filament 58, and an introduction pipe 59 for Ar gas and the like that are installed in the interior of this cylindrical container 56, and it can irradiate ions in a parallel manner in a beam shape from the distal end of the container 56.

As shown in FIG. 5, the ion gun 53 is oppositely arranged so that the center axis thereof inclines with an inclination angle θ with respect to the upper surface (film forming surface) of the base material A. It is preferred that this inclination angle θ be in a range of 30 degrees to 60 degrees, but in the case of MgO, it is particularly preferred that it be around 45 degrees. Accordingly, the ion gun 53 is arranged so as to be able to irradiate ions with an inclination angle θ with respect to the upper surface of the base material A. Note that the ions that are irradiated onto the base material A by the ion gun 53 may be ions of a rare gas such as $He^+$, $Ne^+$, $Ar^+$, $Xe^+$, $Kr^+$ or the like, or a mixture of ions consisting of those and oxygen ions.

The sputtering beam irradiation device 54 forms a configuration equivalent to the ion gun 53, and is able to eject the constituent particles of the target 52 by irradiating ions to the target 52. Note that in the device according to the present embodiment, since it is essential to be able to eject constituent particles of the target 52, by making a constitution that can eject the constituent particles of the target 52 by impressing a voltage with a high-frequency coil or the like on the target 52, the sputtering beam irradiation device 54 may be omitted.

Next, the method of forming a polycrystalline thin film on the base material A using a device that has the aforementioned configuration shall be described. In order to form a polycrystalline thin film on the base material A, along with using a predetermined target, an angle adjustment mechanism is adjusted so that the ions irradiated from the ion gun 53 can be irradiated at an angle of around 45 degrees to the upper surface of the base material holder 51. Next, the interior of the container that houses the base material is evacuated to achieve a decompressed atmosphere. Then, the ion gun 53 and the sputtering beam irradiation device 54 are operated.

When the ions are irradiated from the sputtering beam irradiation device 54 to the target 52, the constituent particles of the target 52 are ejected and fly onto the base material A. Simultaneously with depositing the constituent particles ejected from the target 52 onto the base material A, mixed ions of Ar ions and oxygen ions are irradiated from the ion gun 53. The inclination angle θ when performing ion irradiation is, for example when forming MgO, preferably in a range of 40 to 60 degrees.

Hereinbelow, the embodiment of the present invention shall be described in detail with examples, but the present invention is not limited to these examples.

Production Example 1

In Production Example 1, the underlying layer of an alignment film for an oxide superconducting conductor shown in FIG. 1 is produced.

A Hastelloy tape with a polished surface having a width of 10 mm is used as the metal base material 11. The film forming device shown in FIG. 4 is used to form the underlying layer of an alignment film for an oxide superconducting conductor in which the $Al_2O_3$ layer (10 nm) serving as the diffusion prevention layer 12 and the $Y_2O_3$ layer (2 nm) serving as the bed layer 13 are repeatedly laminated five times on this metal base material 11. The formation conditions of the underlying layer of an alignment film for an oxide superconducting conductor are as follows.

Target number: 2
Target: $Al_2O_3$ plate with width of 30 cm and length of 80 cm, $Y_2O_3$ plate with width of 30 cm and length of 20 cm arranged in a row in the lengthwise direction of the metal tape
Lane number: 5
Ion gun voltage: 1500 V
Ion gun current: 500 mA
Travel speed of base material: 150 m/h
Film formation temperature: room temperature An MgO layer (2 to 10 nm; IBAD-MgO layer) that constitutes the rock salt structure layer 14 is formed by the IBAD method on the underlying layer of an alignment film for an oxide superconducting conductor that was formed above. The IBAD-MgO layer at this time is manufactured while irradiating an ion assist beam by the rare gas ion beam such as Ar at an angle of 45 degrees onto the base material, at room temperature.

Figure 9:
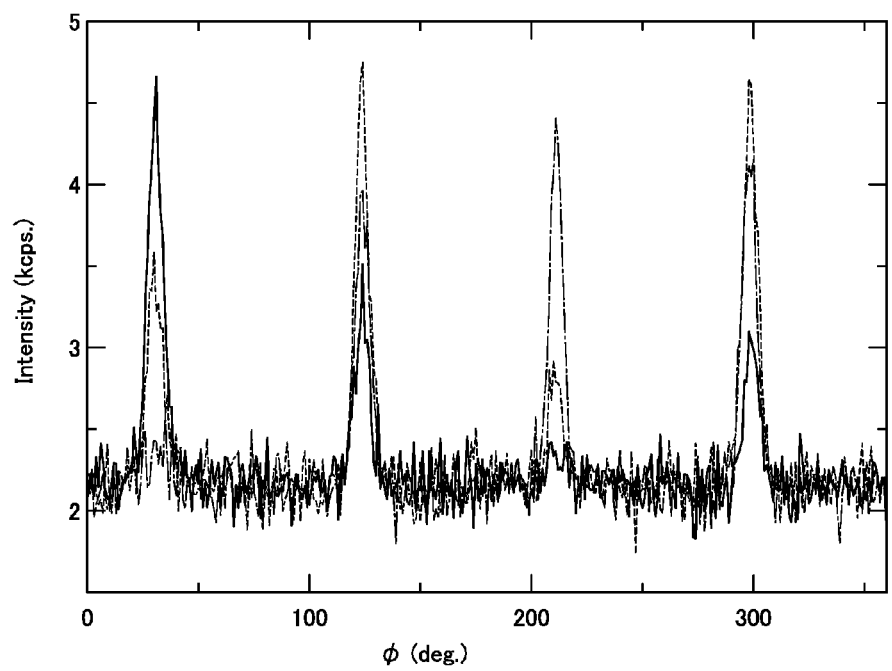
FIG. 9 is a (220) pole figure of the MgO film that is formed on the underlying layer of an alignment film for an oxide superconducting conductor.

Next, in order to measure the half width ($\Delta\Phi$), MgO is epitaxially grown by an ion beam method to laminate an MgO layer (about 100 nm) on the IBAD-MgO layer, and the thin film laminate 20 is formed as shown in FIG. 2. The MgO layer at this time is manufactured at 200° C. For the MgO layer that is produced in this way, the half width of the in-plane crystal axis was measured. The results are shown in Table 1 (Examples 1 to 4). Also, the MgO (220) pole figure of the MgO layer that was created is shown in FIG. 9.

In the description relating to the present invention, unless otherwise specified, the rock salt structure layer 14 (or the IBAD-rock salt structure layer 14) is a concept of an IBAD-MgO layer, or a layer that includes an IBAD-MgO layer and an epitaxially laminated MgO layer. In the description of the production example, unless otherwise specified, the MgO layer is a concept that includes an IBAD-MgO layer and an epitaxially laminated MgO layer.

Production Example 2

Figure 7:
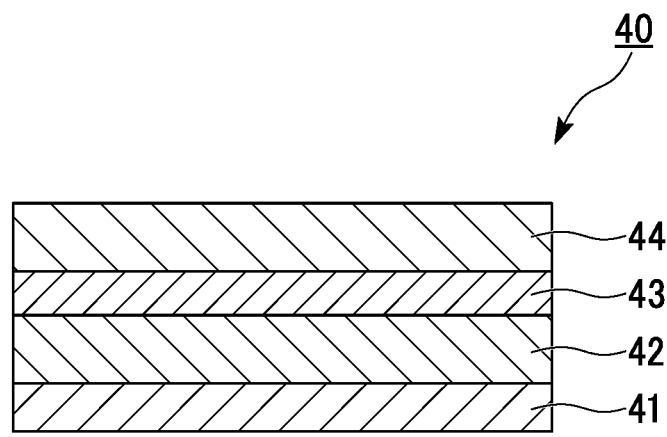
FIG. 7 is a drawing that schematically shows a cross section of the thin film laminate of Comparative Examples 1 and 2.

FIG. 7 is a drawing that schematically shows a cross section of the thin-film laminate 40 that is produced in Production Example 2.

A Hastelloy tape with a polished surface having a width of 10 mm is used as the metal base material 41. After forming a $Al_2O_3$ layer (100 nm) as the diffusion prevention layer 42 on this metal base material 41 by a sputter method, a $Y_2O_3$ layer (20 nm) serving as the bed layer 43 is formed by a sputtering method. As shown in FIG. 7, only one layer each of the diffusion prevention layer 42 and the bed layer 43 are formed.

In the same manner as Production Example 1, an IBAD-MgO layer (approximately 2 to 10 nm) and an epitaxially laminated MgO layer (approximately 100 nm) are laminated to form the thin film laminate 40 as shown in FIG. 7, and the half width ($\Delta\Phi$) of the in-plane crystal axis of the MgO layer 44 was measured. The results are shown in Table 1.

Here, the MgO layer 44 is a concept of an IBAD-MgO layer, or a layer that includes an IBAD-MgO layer and an epitaxially laminated MgO layer, and is a concept that corresponds to the rock salt structure layer 14 in Production Example 1.

TABLE 1

| | | Alignment of MgO Layer ($\Delta\Phi$) |
|---|---|---|
| Production Example 1 | Example 1 | 11.0° |
| | Example 2 | 12.3° |
| | Example 3 | 11.9° |
| | Example 4 | 13.4° |
| Production Example 2 | Comparative Example 1 | 10.9° |
| | Comparative Example 2 | 12.6° |

As is evident from the results shown in Table 1, the MgO layer that is formed in Production Example 1 is formed with a good crystal orientation comparable with the MgO layer of Production Example 2. In Production Example 1, exchanging the targets is unnecessary, and so it is possible to form a multi-layer film with one process. Therefore, compared to a conventional film forming method in which target exchange is required as in Production Example 2, a shortening of the production time becomes possible, and it is possible to reduce production costs.

Figure 8:
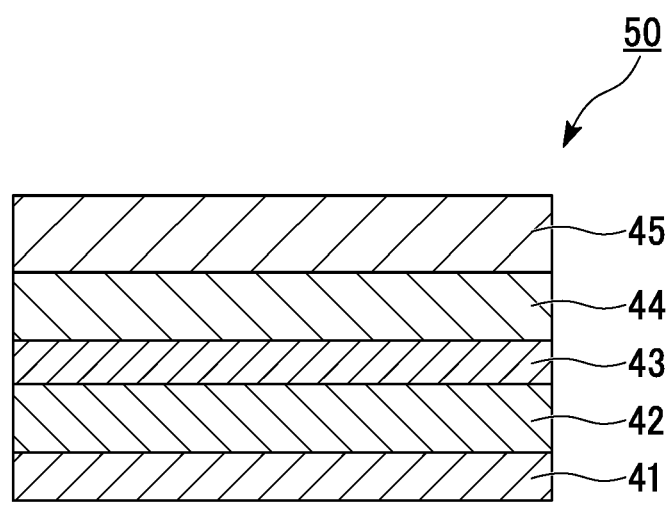
FIG. 8 is a drawing that schematically shows a cross section of a superconductor in which an oxide superconductive layer is laminated on the thin film laminate of Comparative Example 1.

Also, 1000 nm of a YBCO superconductive layer (oxide superconductive layer 15) (YBCO: $YBa_2Cu_3O_{7-x}$) was formed at 1000° C. by the PLD method (pulse laser deposition method) on the MgO layer created in Example 1 that is shown in Table 1 (refer to FIG. 3 for the laminate structure). As a result of evaluating those characteristics, it was confirmed that a high performance a critical current density Jc=2.9 $MA/cm^2$ and a critical current Ic=290 A was obtained at the liquid nitrogen temperature. On the other hand, when 1000 nm of a YBCO superconductive layer was formed at 1000° C. by the PLD method on the MgO layer created in Comparative Example 1 shown in Table 1, and the performance was evaluated, superconductivity was not exhibited (refer to FIG. 8 for the laminate structure). From these results, the underlying layer of an alignment film for an oxide superconducting conductor of Example 1, by having a laminate structure in which the diffusion prevention layer and the bed layer are repeatedly laminated, in addition to the diffusion prevention effect of the $Al_2O_3$ layer by the diffusion prevention layer, the diffused metal trap effect at the interface of each laminated film is included. Therefore, even in a high-temperature process as high as 1000° C., it has a high diffusion prevention effect causing no diffusion of the base material constituent element diffusing from the metal base material to the MgO layer and the YBCO superconducting layer. On the other hand, in Comparative Example 1, as a result of the base material constituent element diffusing from the metal base material to the MgO layer and the YBCO superconducting layer by the 1000° C. high-temperature process, the crystal orientation of the MgO layer and the YBCO superconductive layer decreases, and it is not longer possible to express the superconductivity. From the above, it was confirmed that the underlying layer of an alignment film for an oxide superconducting conductor of Example 1 according to the embodiment of the present invention has a high diffusion prevention effect.

From the above result, according to the underlying layer of an alignment film for a superconducting conductor according to an aspect of the present invention, by making a laminate structure in which the thin films of a diffusion prevention layer and a bed layer are cyclically laminated, a high diffusion prevention effect is obtained without the thickness of the underlying layer of an alignment film increasing.

In addition, according to the method and device for forming the underlying layer of an alignment film for a superconducting conductor according to an aspect of the present invention, the underlying layer of an alignment film for a superconducting conductor with high diffusion prevention effect can be formed by one process, and it is possible to lower the production costs by shortening the film formation time.

What is claimed is:

1. A method of forming an underlying layer of an alignment film for an oxide superconducting conductor, comprising:
   causing the base material to travel a plurality of times between at least a pair of turnaround member groups consisting of a plurality of coaxially disposed turnaround members that change a movement direction of the base material, which travels between a base material feed mechanism and a base material take-up mechanism, the base material feed mechanism feeding a base material, and the base material take-up mechanism taking up the base material;
   arranging two or more kinds of targets along a lengthwise direction of a base material so as to face a surface of the base material;
   simultaneously irradiating an ion beam on surfaces of the two or more kinds of targets to deposit constituent particles of the two or more kinds of targets on the surface of the base material in the order of the arrangement of the two or more kinds of targets; and
   forming a laminate in which two or more kinds of thin films are repeatedly laminated on the surface of the base material by passing the base material through a deposition region of the constituent particles a plurality of times so that the constituent particles of the two or more kinds of targets are repeatedly deposited on the surface of the base material at each passage.

2. The method of forming an underlying layer of an alignment film for an oxide superconducting conductor according to claim 1, wherein
   the two or more kinds of targets include a target that uses a material for a diffusion prevention layer and a target that uses a material for a bed layer;
   a rock salt structure layer is formed by an ion beam assist method on a surface of the bed layer that is formed by the target that uses the material for the bed layer; and
   the bed layer orders a crystal orientation of the rock salt structure layer.

3. An underlying layer of an alignment film for an oxide superconducting conductor that is provided between a base material and a rock salt structure layer that is formed by an ion beam assist method, wherein
   the underlying layer of an alignment film for an oxide superconducting conductor is provided with a laminate in which a diffusion prevention layer and a bed layer are repeatedly laminated, wherein
   the diffusion prevention layer includes silicon nitride, aluminum oxide, or a rare-earth metal oxide, and the total thickness of the laminated diffusion prevention layer is in the range of 10 to 400 nm, and
   the bed layer is a rare-earth oxide layer, and total thickness of the laminated bed layers is in the range of 10 to 100 nm.

4. The underlying layer of an alignment film for an oxide superconducting conductor according to claim 3, wherein
   the laminate consisting of a diffusion prevention layer and a bed layer being repeatedly laminated.

5. The underlying layer of an alignment film for an oxide superconducting conductor according to claim 3 that is formed by the method according to claim 1.

6. A film forming device for an underlying layer of an alignment film for an oxide superconducting conductor, comprising:
   a base material feed mechanism that feeds a base material;
   a base material take-up mechanism that takes up the base material;
   at least a pair of turnaround member groups consisting of a plurality of coaxially disposed turnaround members that change a movement direction of the base material, which travels between the base material feed mechanism and the base material take-up mechanism;
   two or more kinds of targets that are arranged in a row in a lengthwise direction of the base material, facing a surface of the base material which travels between the turnaround member groups; and
   an ion beam generating mechanism that simultaneously irradiates an ion beam on the two or more kinds of targets, wherein
   a plurality of rows of the base material is disposed in a deposition region of constituent particles of the two or more kinds of targets by causing the base material to travel a plurality of times between the turnaround member groups.

7. The film forming device for an underlying layer of an alignment film for an oxide superconducting conductor according to claim 6, wherein
   a laminate in which two or more kinds of thin films are repeatedly laminated on the surface of the base material is formed by simultaneously irradiating an ion beam on surfaces of the two or more kinds of targets to cause constituent particles of the two or more kinds of targets to be deposited on the surface of the base material in the order of the arrangement of the two or more kinds of targets.

8. The film forming device for an underlying layer of an alignment film for an oxide superconducting conductor according to claim 6, wherein
   at least a pair of the turnaround member groups are arranged so that their respective axes are mutually parallel.

9. The film forming device for an underlying layer of an alignment film for an oxide superconducting conductor according to claim 6, wherein
   the laminate in which two or more kinds of thin films are repeatedly laminated includes at least a dispersion prevention layer and a bed layer.

10. The method of forming an underlying layer of an alignment film for an oxide superconducting conductor according to claim 1, wherein
   the two or more kinds of targets are provided in a same treatment container.

11. The underlying layer of an alignment film for an oxide superconducting conductor according to claim 3, wherein
   the two or more kinds of targets are provided in a same treatment container.

\* \* \* \* \*